(12) United States Patent
Hartley et al.

(10) Patent No.: US 6,437,347 B1
(45) Date of Patent: *Aug. 20, 2002

(54) TARGET LOCKING SYSTEM FOR ELECTRON BEAM LITHOGRAPHY

(75) Inventors: John George Hartley, Fishkill, NY (US); Rodney Arthur Kendall, Ridgefield, CT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/290,785

(22) Filed: Apr. 13, 1999

(51) Int. Cl.[7] .............................................. H01J 37/304
(52) U.S. Cl. .................. 250/491.1; 250/398; 250/252.1
(58) Field of Search ........................... 250/491.1, 492.2, 250/252.1, 398

(56) References Cited

U.S. PATENT DOCUMENTS

| | | | |
|---|---|---|---|
| 3,874,916 A | * | 4/1975 | Livesay et al. .......... 250/491.1 |
| 4,119,854 A | | 10/1978 | Tanaka et al. .............. 250/397 |
| 4,469,949 A | | 9/1984 | Mori et al. |
| 4,818,885 A | | 4/1989 | Davis et al. |
| 4,967,088 A | | 10/1990 | Stengl et al. ............. 250/491.1 |
| 5,043,586 A | * | 8/1991 | Giuffre et al. ........... 250/491.1 |
| 5,047,647 A | | 9/1991 | Itoh et al. |
| 5,315,123 A | | 5/1994 | Itoh et al. |
| 5,424,548 A | | 6/1995 | Puisto |
| 5,502,306 A | | 3/1996 | Meisburger et al. |
| 5,552,611 A | | 9/1996 | Enichen ................... 250/491.1 |

* cited by examiner

Primary Examiner—Kiet T. Nguyen
(74) Attorney, Agent, or Firm—Eric W. Petraske

(57) ABSTRACT

An e-beam lithographic system capable of in situ registration. The system has an optics section such as a VAIL lens. A controllable stage moves a substrate with respect to the beam axis to place substrate writing fields beneath the beam. A field locking target between the optics section and the stage has an aperture sized to permit the beam to write a target field on the substrate. The field locking target includes alignment or registration marks around the aperture. A differential interferometric system measures the relative positions of the field locking target and the stage and controls stage position. The beam patterns the substrate on a field by field basis. As the stage is moving into position for each field, the beam is swept until it hits the alignment marks, thereby checking system alignment. The beam control data, i.e., coil currents necessary to hit the marks are stored, and drift correction values calculated from the beam control data. Meanwhile, pattern beam control is compensated by the drift correction values.

21 Claims, 9 Drawing Sheets

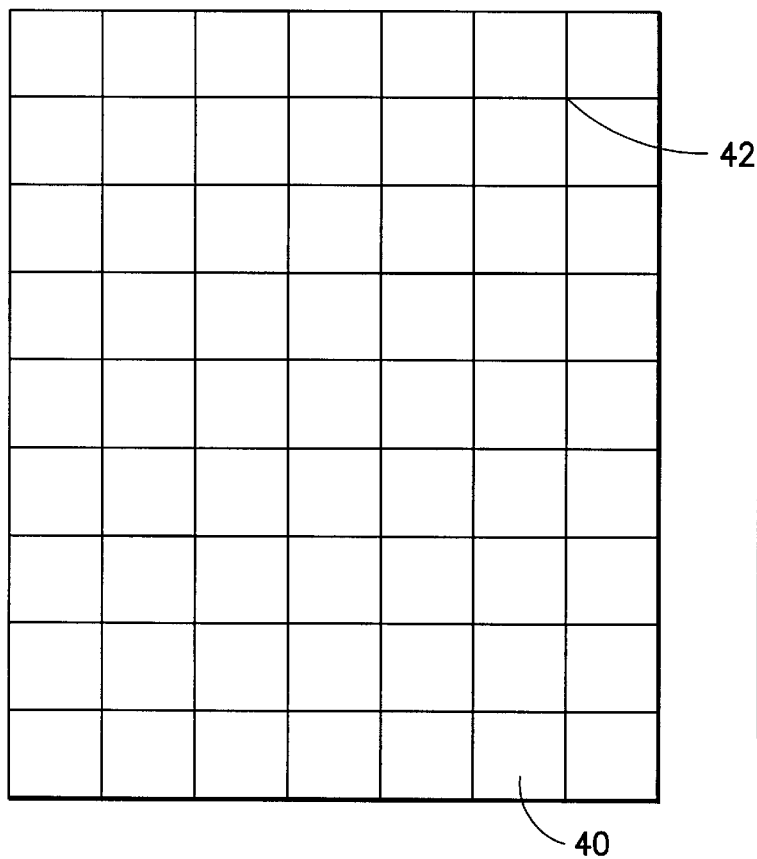
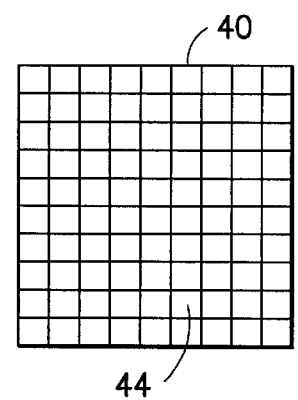
FIG.1A          FIG.1B
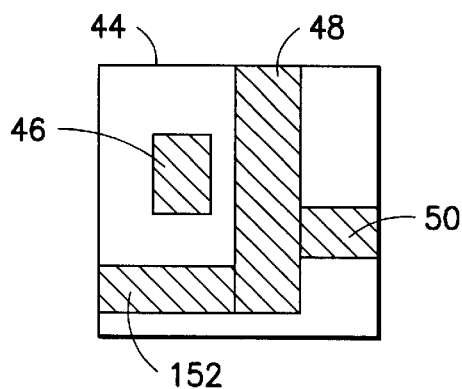
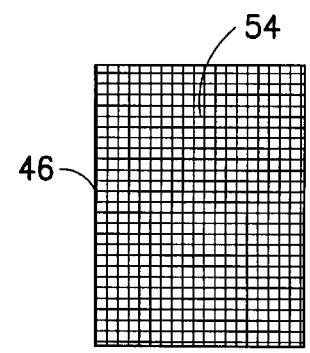
FIG.1C          FIG.1D

TARGET LOCKING SYSTEM FOR ELECTRON BEAM LITHOGRAPHY

BACKGROUND OF THE INVENTION

1. Field of the Invention

The present invention generally relates to particle beam lithography systems and, more particularly, to a particle beam lithography system with in situ calibration and calibration methods therefor.

2. Background Description

Electron beam (e-beam) lithography tools are commonly used in semiconductor manufacturing to form sub-micron shapes on a semiconductor wafer. Shapes are formed by directing a beam of electrons from a source at one end of a column onto a photoresistive layer on a substrate at an opposite end of the column. A typical substrate may be 200–300 mm in diameter or larger. These submicron shapes may be formed either by writing the shape directly onto a photoresistive layer on the substrate, wherein the substrate is a semiconductor wafer; or, by writing the shape onto a photoresistive layer on a substrate which is used as a mask, subsequently, to print the shape onto the semiconductor wafer.

Further, there are two broad types of writing modes used in electron beam lithography. The first type is referred to as "blind mode" or a "dead reckoning mode" and is commonly used in mask making. In the blind mode, the substrate is a featureless blank coated with resist and all of the patterns are placed by dead reckoning. The second mode, which may be referred to as the "registered write mode" or a "direct write mode," is commonly used in direct write applications, i.e. writing directly onto a semiconductor wafer, in what are referred to as device fabrication runs. In the registered write mode case, the patterns must be precisely located relative to previous levels which requires registration targets built into each level and the substrate as well. Regardless of the mode employed, accurately placing or repeating sub-micron shapes at precise locations across a distance of 200–300 mm demands precise beam registration.

However, even if the beam is registered adequately when pattern printing begins, during the course of writing the pattern, the e-beam may exhibit what is referred to as drift, i.e., exhibiting increasing inaccuracy in one direction as time passes. So, in order to maintain adequate precision, pattern writing may be interrupted periodically, depending on the particular tool's inherent e-beam drift, to check tool registration and, whenever registration error exceeds an acceptable tolerance, to adjust the beam.

Normally, the substrate is held on a stage opposite (beneath) the beam source and this registration measurement involves diverting the stage to position a registration target under the beam. Then, the beam is scanned over the registration target, the target's location is measured and the target's measured location is compared against an expected result. Any measured errors are corrected by adjusting the beam or adjusting stage positional controls. Then, the stage is returned to its former position to resume writing the mask pattern. This measurement and reregistration can be time consuming.

Furthermore, for this e-beam registration approach, the registration measurement takes place at a stage location other than where the pattern is actually written. Consequently, even after measuring and correcting errors, moving the stage back into position from the measurement area may actually introduce errors, such as from the stage slipping or from other move related stresses. Also, to assure complete accuracy, the beam should be reregistered, frequently, preferably at each field. However, when throughput is a consideration, as it nearly always is, it is impractical to correct the beam registration prior to printing each field.

Consequently, attempts have been made to perform registration in place while writing the pattern, i.e., in situ. One in situ approach, suggested by MIT as reported in "Spatial-phase-locked Electron-beam Lithography:Inital Test Results", pp2342–5 J. Vac. Sci. Technol. B. Vol. 11, No 6 November December 1993, is referred to as the Spatial-Phase-Locked E-Beam Lithography (SPLEBL) system. Implementing a SPLEBL type system would require including special registration patterns on every substrate and a blanket exposure of the substrate for the registration cycle. However, such a blanket exposure is unusable for high sensitivity resists. Further, a SPLEBL type system also would require a sophisticated method of extracting positioning information during exposure. While such a sophisticated method may be feasible with a Gaussian or fixed beam shape; it is highly improbable that such a method could be developed for a variable shape beam such as a described in U.S. Pat. No. 4,243,866 entitled "Method and Apparatus for Forming a Variable Size Electron Beam" to Pfeiffer et al.

Another in situ registration technique has been proposed for x-ray membrane exposure by Scientists at Naval Research Laboratories (NRL) as described, for example, by Perkins et al. in "Improving Pattern Placement Using Through the Membrane Signal Monitoring," J. Vac. Sci. Technol. B, Microelectron. Nanometer Struct. (USA) Vol. 16, No. 6 November December 1998 pp3567–71. This technique requires fixing a registration grid to the carrier, directly under the x-ray membrane. The registration grid forms a Schottky diode junction with the carrier, allowing it to function, simultaneously, as a high gain detector of incident electrons. However, this registration technique is limited to high transmission membranes and its resolution capability has not yet been evaluated. Further, below the membrane, the beam diverges and scatters rapidly, which limits the usefulness of this technique.

U.S. Pat. No. 4,119,854 entitled "Electron Beam Exposure System" to Tanaka et al. teaches an e-beam exposure system that may be compensated for e-beam drift and workpiece drift. The system of Tanaka et al. uses a pair of x and y lines as a reference target. The relative position of the stage with respect to the x and y lines is determined using differential interferometry. A coil is included for refocusing the beam onto the x, y reference target lines. However, refocusing the beam introduces hysteresis into a system such as that taught in Tanaka et al. The hysteresis, itself reduces beam accuracy.

Thus, there is a need for in situ registration methods for e-beam lithography system and more particularly for VAIL e-beam lithography systems.

SUMMARY OF THE INVENTION

It is therefore a purpose of the present invention to improve e-beam lithography system registration;

It is another purpose of the present invention to reduce the time required for reregistering e-beam lithography systems;

It is yet another purpose of the present invention to improve VAIL e-beam lithography system accuracy;

It is yet another purpose of the present invention to improve VAIL e-beam lithography accuracy without impacting e-beam tool throughput.

The present invention is an e-beam lithographic system capable of in situ registration. The preferred system is a Variable Axis Immersion Lens (VAIL) e-beam system and is a double hierarchy deflection system. A controllable stage moves a substrate with respect to the beam axis placing the intended substrate writing field within an aperture on a field locking target. The field locking target is located between the optics section and the substrate and the aperture is sized to permit the beam to write the field. The field locking target includes alignment marks around the aperture. A differential interferometric system measures the relative positions of the field locking target and the stage. As the stage is moving into position for writing a field, the beam is swept to hit the alignment marks, checking system alignment. The beam control data (coil currents and electrostatic deflection plate voltages) required to hit the marks are stored, and drift correction values calculated and the field beam control data is compensated. Writing resumes on the newly positioned field with the beam control data corrected by the calculated drift correction values.

The field locking target may include a mechanical adjustment for fine tuning aperture location. After an initial calibration of the system, the field locking target is adjusted to position the alignment marks at their expected location.

BRIEF DESCRIPTION OF THE DRAWINGS

The foregoing and other objects, aspects and advantages will be better understood from the following detailed preferred embodiment description with reference to the drawings, in which:

FIGS. 1A–D show the pattern relationship between spots, rectangles, subfields, fields and a skeleton;

DETAILED DESCRIPTION OF A PREFERRED EMBODIMENT OF THE INVENTION

Figure 2:
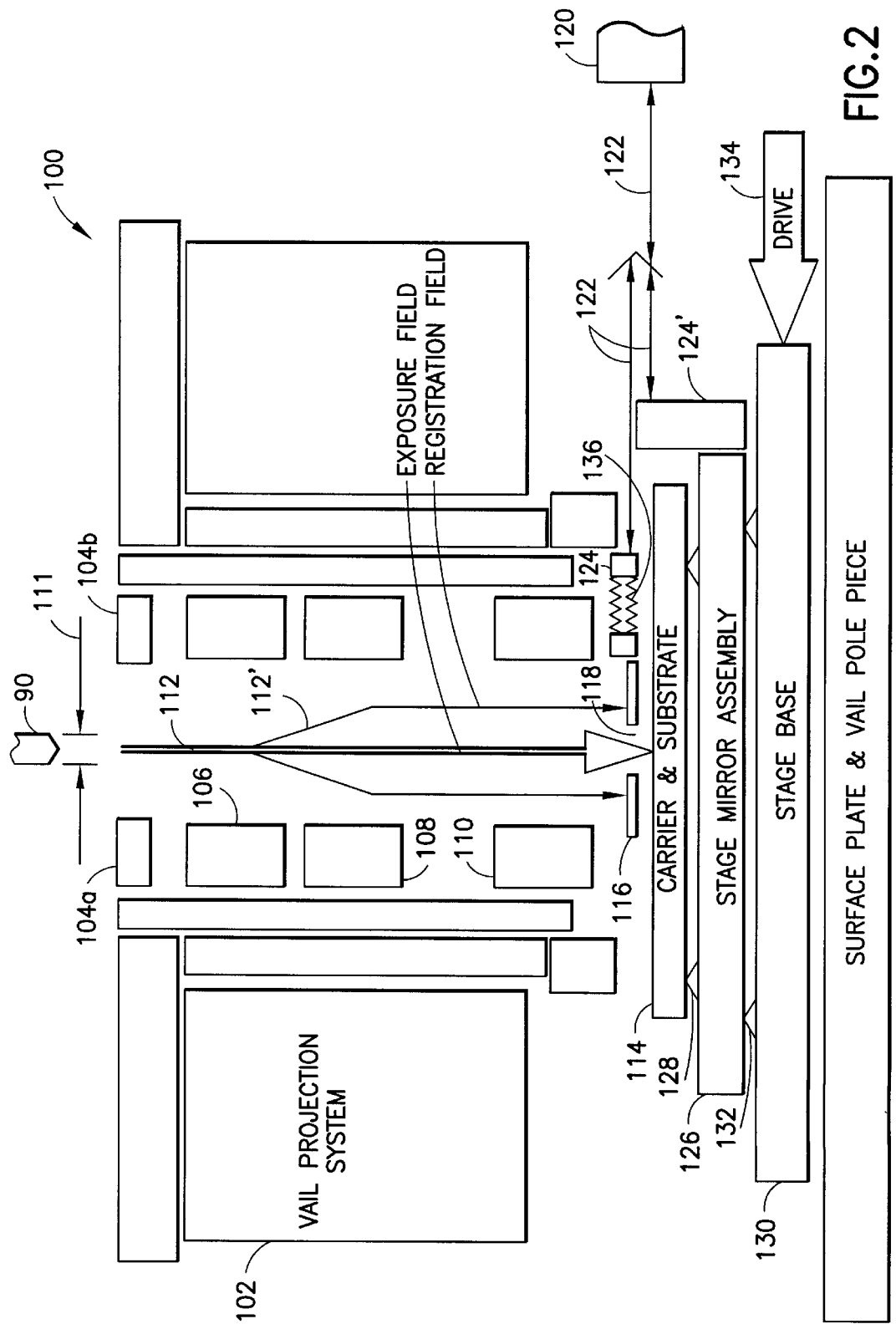
FIG. 2 is a cross-sectional diagram of the preferred embodiment e-beam lithography system.

Referring now to the drawings, and more particularly, FIGS. 1A–D represent the hierarchical relationship between the individual components printed to form a pattern. FIG. 1A represents a typical substrate pattern that is divided into an array of fields 40 to accommodate a pattern which is much larger than the preferred e-beam lithography system's writing field. The collection of fields 40 is referred to as a skeleton 42. Each field 40 is identified by the x,y address of its center point. In FIG. 1B, each field 40 is divided into multiple sub-fields 44, each identified by the x, y address of its center point. In FIG. 1C, each subfield 44 may include one or more rectangles 46, 48, 50 and 52. Rectangles are logical groupings and are not specifically addressed. In FIG. 1D, each rectangle 46, 48, 50 and 52 is formed from groups of individual spots 54.

The preferred e-beam lithography system is a Variable Axis Immersion Lens (VAIL) e-beam system and is a double hierarchy deflection system. U.S. Pat. No. 4,376,249 entitled "Variable Axis Electron Beam Projection System" to Pfeiffer et al. and U.S. Pat. No. 4,544,846 entitled "Variable Axis Immersion Lens Electron Beam Projection System" to Langer et al., both assigned to the assignee of the present invention and incorporated herein by reference, are examples of VAIL e-beam systems. Although the preferred embodiment system is a VAIL lens system, the present invention is not intended to be limited to VAIL lens e-beam systems and other deflection systems may employ the present invention as well with appropriate modification. Furthermore, as used herein, substrate is not intended as a limitation, but merely refers to material bearing the surface upon which the pattern is being printed.

FIG. 2 shows a cross-sectional diagram of the preferred embodiment e-beam lithography system 100. The preferred embodiment system includes an optics section 102 with a registration focus coil 104a, an autofocus coil 104b, beam deflection coils 106, 108, a projection lens axis shifting yoke 110 and beam deflection plates 111. Although registration focus coil 104a and autofocus coil 104b are represented as two concentric coils in FIG. 2, these two coils could be combined into a single shared common coil with a summing circuit combining their individual currents into a single driving current. An e-beam source 90 emits a beam represented by arrow 112, which, during writing, travels to a target field on a substrate held on carrier 114. Autofocus coil 104b adjusts beam focus for target height variations resulting from substrate imperfections, thickness variations, etc. In the preferred Vail lens system, double deflection yokes 106, 108 magnetically deflect the beam 112; and axis shifting coil 110 shifts the variable axis of the projection lens to follow the deflected beam 112. The relatively slow magnetic deflection from coils 106, 108 determines the subfield location, while within the subfield, the beam 112 is deflected by the high speed electrostatic deflection plates 111.

A passive field locking target 116 permits the beam 112 to write the pattern in the substrate's target field through an aperture 118. The preferred aperture is rectangular and is large enough to permit writing an entire field. During normal pattern writing, substrate subfields are placed within the field locking target aperture 118 and electrostatic deflection is used to write spots which form the pattern shapes. During registration, the subfield is defined as being over marks on the field locking target 116 adjacent to the aperture 118; and, the beam is deflected accordingly, as represented by arrows 112'. Then, the marks on the field locking target 116 are scanned, in situ, with the electrostatic deflection, to provide near real time positional feedback information. Typically, the marks on the field locking target 116 are located 4 mm above the normal writing plane of the substrate.

So, within the main field 40, magnetic deflection is used to raster the beam to an x, y address for a selected subfield 44. Then, the sub-field 44 is patterned using vectored electrostatic deflection. Rectangles are not specifically addressed by any element of deflection. Instead, the shaped beam is electrostatically positioned at each spot 54 for sufficient time to allow deflection settling and resist exposure time. So, groups of spots 54 are written to form a rectangle 46, 48, 50 or 52. Rectangles 46, 48, 50 and 52 are written to form a subfield 44. Subfields 44 are written to form a field 40. Fields 40 are written to form a skeleton 42 which completes the pattern.

After forming all of the rectangles 46, 48, 50 and 52 of the selected subfield 44, the beam is magnetically deflected to the next selected subfield 44. After forming all of the subfields 44 in the selected field 40, the stage moved to position the next selected field 40 in the aperture 118, and so on, until the skeleton 42 is complete.

As indicated hereinabove, while some e-beam systems, e.g., Tanaka et al., may include a coil for refocusing the beam onto a reference target, as with any electromagnet, hysteresis is introduced into the system each time the electromagnetic lens refocuses the beam. This focusing hysteresis effect of the electromagnetic lens occurs as a result of superposition of the field from the current flowing through the lens windings with the fields induced in the surrounding magnetic medium. The first time a magnetic lens is energized, a field is created which is the vector sum of these two superimposed fields. When the coil current is turned off, a residual magnetic field remains from magnetization of the surrounding medium. If, prior to the cycling of this lens, the electron beam had been in focus (as happens whenever the beam is moved onto the field locking target), the beam will be out of focus when it is returned to the substrate.

However, in the e-beam system of the present invention, the registration focus coil 104$a$ is continuously cycled between these two locations. This continuous cycling occurs even if the reference target is not being written or scanned and insures that the off state magnetization stabilizes. With the off state magnetization stabilized, an correction offset may be applied to the projection lens. Thus, the focusing hysteresis effect is compensated for in a preferred embodiment system.

For tracking and selecting stage location, the preferred embodiment e-beam system 100 includes a differential interferometric system 120. The interferometric system 120 directs a laser, represented by arrows 122, to laser targets 124 and 124' to measure the relative position of the field locking target 116 to the stage mirror assembly 126. Laser target 124 is mechanically coupled to field locking target 116 and laser target 124' is attached to a stage mirror assembly 126. The carrier 114 is kinematically clamped to the stage mirror assembly 126 at points 128. The stage mirror assembly 126, in turn, is flexure mounted to a stage base 130 at points 132. An x or y drive 134 is attached to an appropriate side of the stage base 130 to drive the stage, typically under computer control, in the x or y direction; and, once in place, to lock the stage in place. A mechanical centering adjustment 136 provides a fine adjustment for the field locking target 116 to precisely place it with respect to the beam. Alternatively, instead of including mechanical centering adjustment 136, the beam could be centered by increasing the magnetic deflection of the beam, but at the expense of increasing system noise.

A pattern is formed by first positioning the stage, under laser control 120, 122, at a corresponding x, y address of a selected field 40. The stage pauses at the selected field 40 and beam exposure begins and continues until the field pattern is complete. It should be noted that the mechanical centering adjustment 136 allows the field locking target 116 to be centered both on an off center field. Mechanically centering the field locking target avoids the noise that would be otherwise induced by providing the deflection field with a sufficient range to electrically compensate for misalignment.

Figure 3:
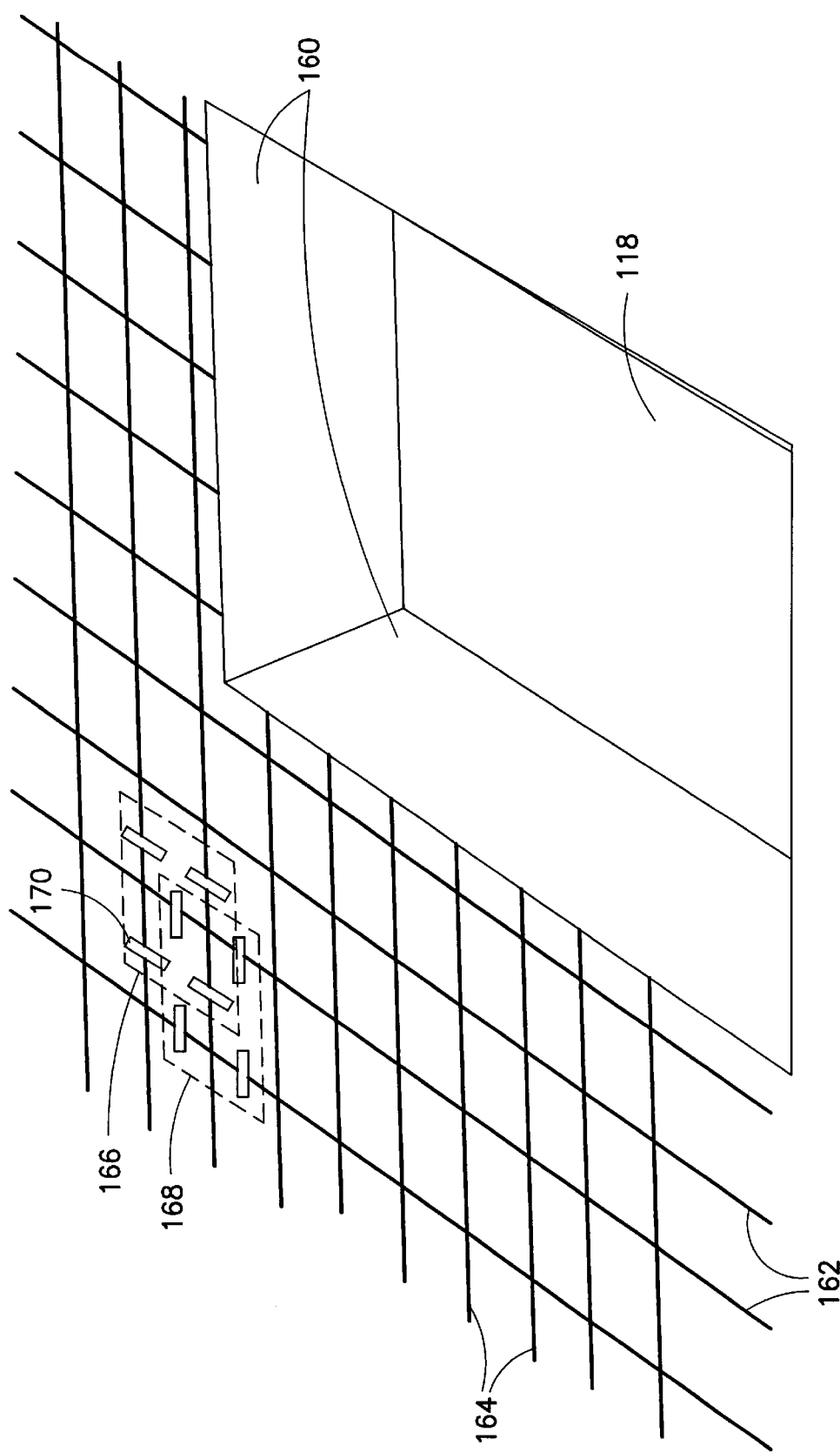
FIG. 3 shows a sectional view of one corner of the field locking target.

FIG. 3 shows a perspective view of a corner of a field locking target 116. Preferably, the field locking target 116 is a carbon substrate with an aperture 118 tailored to be, preferably, 0.2 mm larger than the field size in each direction, e.g., for an 0.9×0.9 mm field size the aperture is 1.1×1.1 mm. Aperture sidewalls 160 and the bottom of the field locking target 116 are coated with gold to provide a radiation barrier. A perpendicular grid (not drawn to scale) or mesh is formed on the upper surface by crisscrossing lines 162, 164 spaced at the subfield periodicity. The lines 162, 164 are of a material selected as having a much higher atomic number (high Z) and, therefore, scatters electrons much more than the carbon background material. So, for the e-beam, selecting contrasting materials with a difference in atomic number of at least one order of magnitude provides a strong material contrast to the scanning electron beam. Thus, the carbon background material has a relatively low atomic number (low Z) providing a high contrast to the high Z gold lines of the preferred embodiment, which results in a high contrast back scatter signal. Then, back scattered electron detection is used to determine the position of the electron beam relative to marks.

Although the preferred field locking target 116 is gold on carbon, other material combinations may be substituted, provided they do not degrade the resulting back scatter effects by reducing the signal to noise ratio or by adversely affecting the e-beam environment. Further, the preferred field locking target 116 individual material thicknesses are not critical, but are selected to be thick enough to block stray electrons or x-rays from reaching the photosensitive pattern layer on the substrate, which would inadvertently expose resist. Thus, the carbon thickness, the bottom gold layer thickness, and the sidewall thickness must be considered together in determining an appropriate thickness for each.

At each corner of aperture 118 are two A1 cycle subfields represented by overlapping dotted line boxes 166 and 168. Subfield 166 includes four vertical scan rectangles 170 that identify the y position of the locking target's horizontal bars 164. Subfield 168 includes four horizontal scan rectangles that identify the x position of the locking target's vertical bars 162. Also, the average of the scan rectangles 170 positions in A1 cycle subfields 166 and 168 serve to identify the location of the field corners relative to the field locking target bars 162 and 164. This positional relationship serves as the basis of computing the field distortion. Individually, each of the four subfield scans 170 establish the x and y components of subfield distortion.

There are several advantages to providing multiple alignment bars 162 and 164. First, with a single mark as in, for example, the Tanaka et al. system, the target field must be located, precisely, with respect to the single mark. This requirement is relaxed or eliminated for a preferred embodiment system by making multiple alignment marks (bars) 162 and 164 available at each corner for registration. Including multiple bars 162 and 164 assures that a registration mark is always located to within a grid period of the edge of the aperture 118. Second, in the preferred embodiment e-beam lithography system 100, only drift errors are measured at the four corners of the aperture 118. This measurement provides sufficient information to correct X and Y translation, X and Y skew (rotation), X and Y magnification and X and Y trapezoidal distortion. Optionally, more precise corrections for even higher order terms, such as barrel-pincushion, symmetric and anti-symmetric quadratic distortion etc. may be generated by including additional target locations for measuring additional error information. Third, at each corner of the preferred embodiment, four vertical 170 and horizontal 172 scans may be made at each calibration location, with each scan located at the nominal subfield limits. These scans provide data to monitor and correct subfield level distortions.

Figure 4:
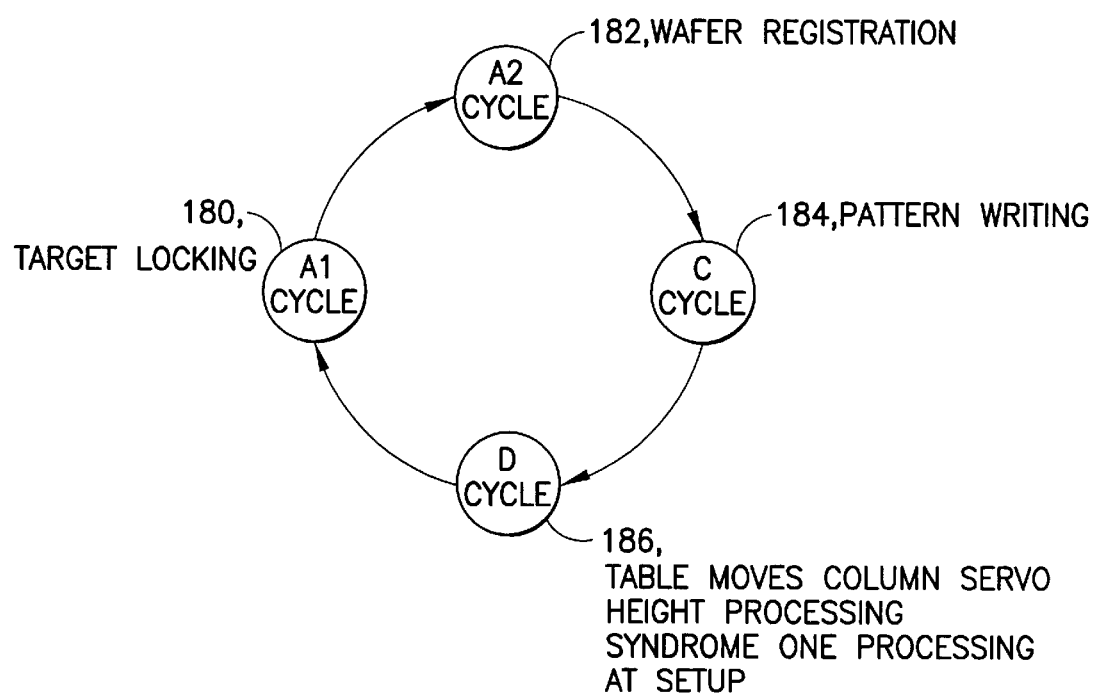
FIG. 4 shows a diagram of operation of the preferred embodiment system.

Having described the preferred embodiment system 100, system 100 operation can be understood with reference to the simple flow diagram FIG. 4. Unlike prior art systems, the preferred embodiment system 100 continuously cycles through 4 distinct phases, an A1 phase 180, an A2 phase 182, a B phase 184 and a C phase 186. During the A1 phase 180, the beam is scanned across reference targets 162, 164 at the four corners of aperture 118. In the direct write mode, the registration marks on the substrate are scanned during the A2 phase 182. The pattern is printed onto the main field of the substrate during the B phase 184. The C phase 186 is preparation for the next field, i.e., the table is moved to shift between fields and, if necessary, beam servos may be adjusted, autofocus height data may be collected, autofocus and field locking coil digital to analog converters (DACs) may be loaded and the pattern may be setup.

The preferred stage 128 includes a permanently mounted system calibration grid. Prior to beginning normal operation, the aperture 118 must be centered, mechanically, with respect to the exposure field. To that end, the beam is scanned over it's full deflection, in focus on the target grid. Back scattered electrons from the calibration grid and the field locking target 116 are detected and displayed. The field locking target's x/y position relative to the deflection field is delineated by the change in focus between the back scattered image of the calibration target and the field locking target. The image from the field locking target 116 is centered in the deflection field using mechanical adjustment 136.

Figure 5:
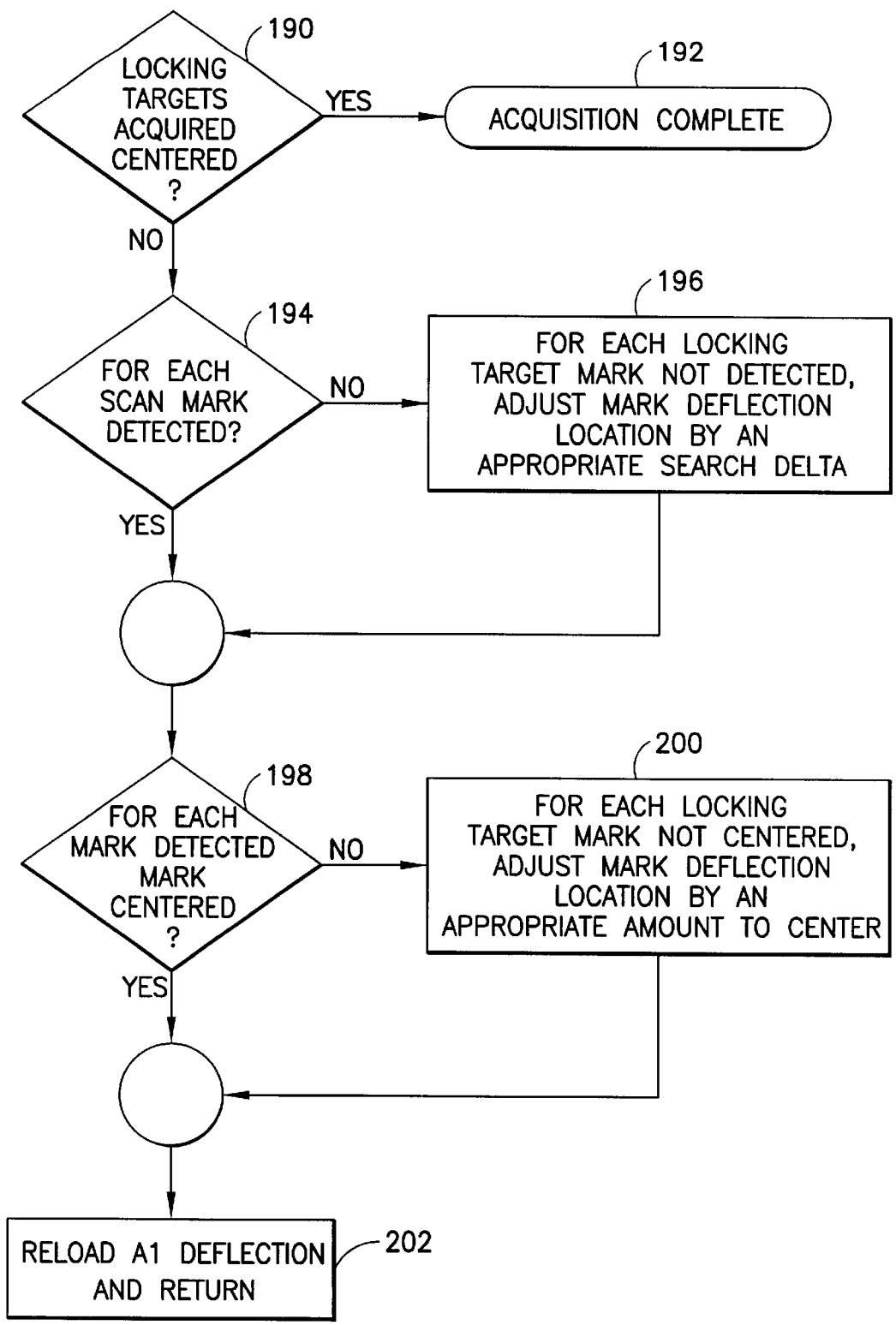
FIG. 5 is a flow diagram of target mark acquisition and centering.

Then, as shown in the target mark acquisition and centering flow diagram of FIG. 5, during an initial A1 phase 180, the beam is scanned to find bars 162 and 164 in each of the four corner A1 subfields 166 and 168. The field is centered and in step 190, the four expected locking target 166, 168 locations, i.e., at the corners of the aperture 118, are scanned to determine if beam to target alignment is sufficiently accurate. If the locking targets are found at their expected location, no further adjustment is necessary, and so, in step 192, target acquisition is complete. If, however, the locking targets are not found at their expected locations in step 190, then, proceeding to step 194, a check is made to determine whether a mark 170 was detected in each scan. If not, then in step 196, for each locking target 166, 168 where a mark 170 was not detected, the mark deflection location is adjusted; and, using an appropriate search delta, such as half the length/width of a subfield, the area in the proximity of the expected mark location is searched. If a mark is initially detected in each scan in step 194 or, after finding the marks in step 196, the individual centering of each mark 170 is checked in step 198. If the marks are not properly centered, then, in step 200, for each off center mark, the mark deflection location is adjusted by an appropriate amount to center the mark. After either finding that all of the marks are centered in step 198 or, after centering off center marks in step 200, the A1 deflection is loaded in step 202 and, the A1 cycle is begun.

Figure 6:
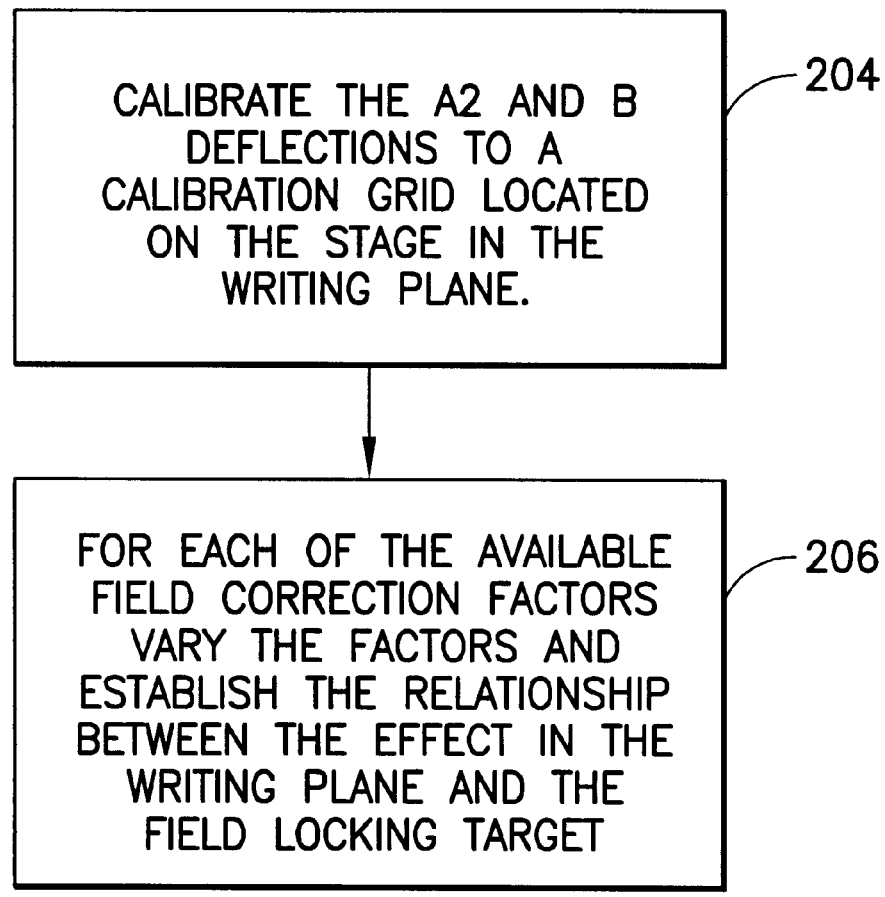
FIG. 6 is a flow diagram for target locking and calibration of the preferred embodiment system.

This is immediately followed by an A2 phase 182 and B cycle 184 where, as represented in the target locking and calibration flow diagram of FIG. 6. First in step 204, the system calibration grid, which is at the writing plane, is scanned and subfield center and corner coordinates are measured and adjusted to bring the deflection field and subfields into alignment with the grid. Then, the deflection control parameters are perturbed by a preselected amount and, the A1, A2 and B phases are re-executed. using the writing plane calibration grid located on the stage, the A2 and B deflections are calibrated to generate correction factors. Then, in step 206, a relationship is established between the affect of the correction factors in the writing plane and at the field locking target.

Immediately after locating the center subfield marks, during A2 and B cycle, the system calibration grid, mounted on the stage at the writing plane height is scanned. Then, the subfield center and corner coordinates are adjusted to bring the deflection field and subfields into alignment with the grid. Finally, the deflection control parameters are varied, intentionally, an identical amount during each of an A1, A2 and B cycle. Any relative displacement between the A1 and A2, B phases is measured and translated into writing plane corrections. After this initial calibration, substrate patterns are formed normally, cycling through all four phases A1, A2, B and C.

As noted above, in the preferred embodiment system 100, field locking is done regardless of the system's operating mode, whether in INACTIVE, STANDBY or ACTIVE mode. Further, whether in STANDBY or ACTIVE mode, the beam is scanned over the reference targets 166, 168 during every A1 cycle 180 to maintain the targets 166, 168 in thermal equilibrium. Without continually scanning the reference targets 166, 168, target temperature will vary unpredictably due to the irregular power input. This temperature variation will cause the reference targets 166, 168 to exhibit unacceptable thermal drift. Although the reference targets 166, 168 are scanned every cycle, processing scan results is optional in STANDBY mode, but processing is mandatory in ACTIVE mode to recalibrate the system.

Further, in a direct write operation, the A2 correction normally overrides any corrections derived from an A1 cycle, making the A1 cycle is superfluous. However, both cycles may be used to perform a field locking diagnostic in a field locking diagnostic mode. In this diagnostic mode, a registration target that is fixed onto the XY stage 114, is moved into the deflection field and the A2 target scan is performed repeatedly on a the registration target. The A1 scans are not processed. The A2 scans are not for generating corrections; but instead, for monitoring field translation drift and distortion. Then, drifts are induced, deliberately, by perturbing the upper column, followed by A1 field locking scans. Corrections are calculated from the A1 field locking scans and applied to the tool. If the system is functioning properly, the A2 scans should not measure any drift because, the drift will have been detected in A1 cycle and applied as a correction for the A2 and B cycle.

Figure 7:
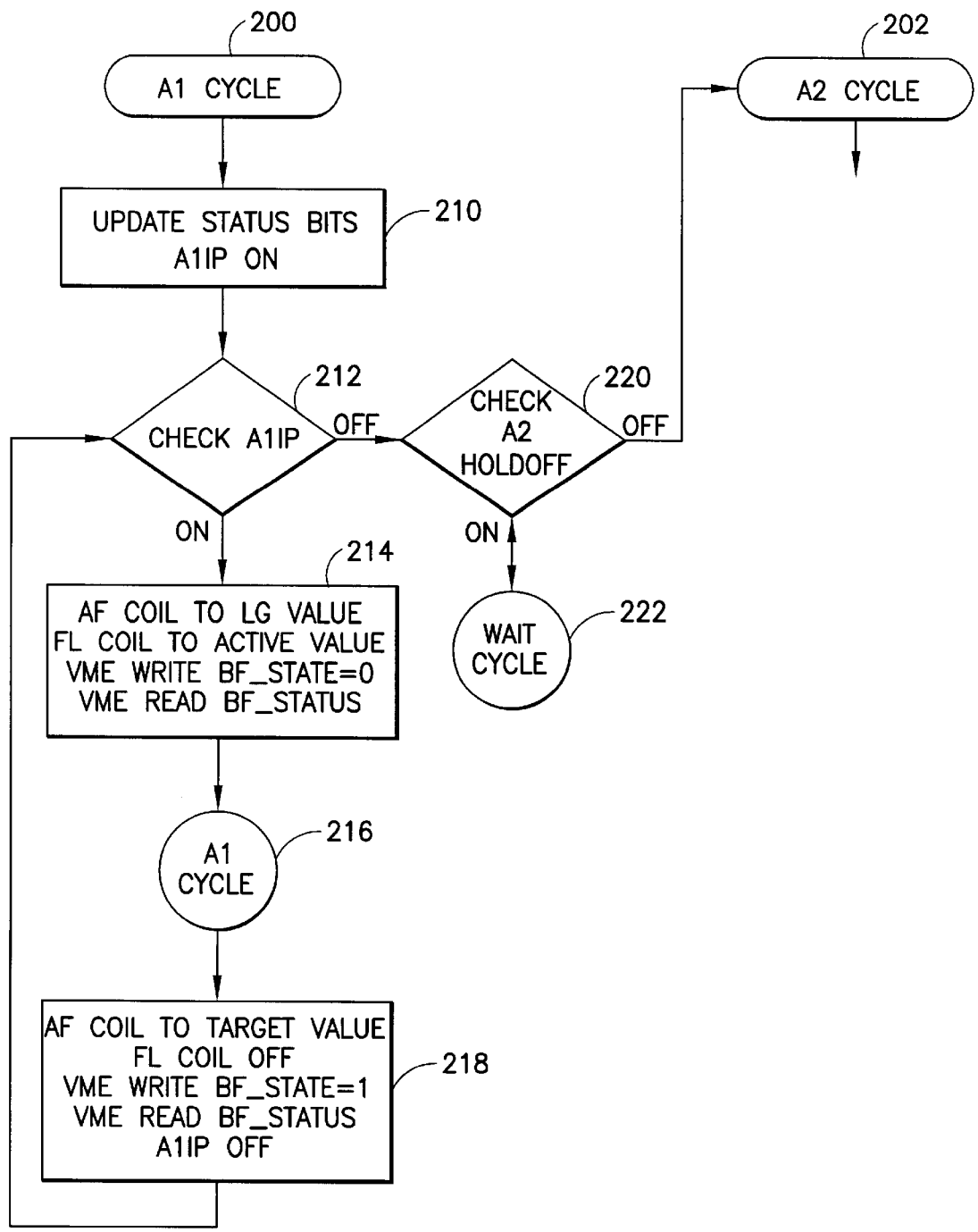
FIG. 7 is a flow diagram of a default A1 cycle.

FIG. 7 is a flow diagram of an initial setup A1 cycle 180, wherein the locking target is not scanned. Prior to centering the deflection on the field locking target 116, stray electrons may reach the substrate. Therefore, prior to centering the beam should not be active whenever there is a substrate on the stage. However, once the locking target has been acquired as described above with reference to FIG. 5, the beam is active in every A1 cycle.

Thus, even though the beam 112 is inactive in the initial setup A1 cycle 180, to maintain a stable duty cycle and to cancel out hysteresis effects, focus coils 104a, 104b, and deflection yokes 106, 108 and lens shifting yoke 110 are cycled. In step 210, upon entering the A1 cycle, status bits are set to indicate that the A1 cycle is in process (A1IP). Then, for the first time, in step 212 the status bits are checked to determine if the A1 cycle is in process as indicated by the A1IP bits being set.

If the A1IP bits are set then, in step 214, the autofocus coil 104b is set to the calibration grid focus value grid location and the registration focus coil 104a is set to its active value. The beam feedback status (BF_STATUS) is placed in the system data path and the beam feedback state (BF_STATE) is set to zero to disable mechanical stage error corrections.

During normal operation, beam feedback information is collected to provide stage positional information in the nanometer range. The collected information is used as a fine tune adjustment to compensate beam placement for stage vibrations and mechanical inaccuracies from the coarser mechanical placement resolution. Typically, stage placement mechanical accuracy is to within what is known as the beam feedback capture range. During registration, when the beam is directed to the registration target 116, the actual stage position is irrelevant and, so, beam feedback is disabled.

Then, in step 216 is the magnetic deflection is driven to actually deflect the beam to each of the corner subfields 166 and 168 to scan the reference target. Once scanning the reference target is complete, in step 218, the autofocus coil is set to the target value (i.e., the field address) and the focus locking coil is turned off. The BF_STATUS is placed in the system data path, the BF_STATE is set to one to enable mechanical stage error corrections and, simultaneously, the A1IP bits are turned off.

Then, in step 212 the A1IP bits are checked again. However, the recheck in step 212 indicates that the A1IP bits are off. So, in step 220, an A2 HOLDOFF signal is checked to determine whether to continue to the A2 cycle. If, in step 220, the A2 HOLDOFF signal is active, the system enters a wait cycle in step 222. Periodically, the A2 HOLDOFF signal is rechecked in step 220 until it is found to be inactive, at which point the system proceeds to an A2 cycle 182.

Figure 8:
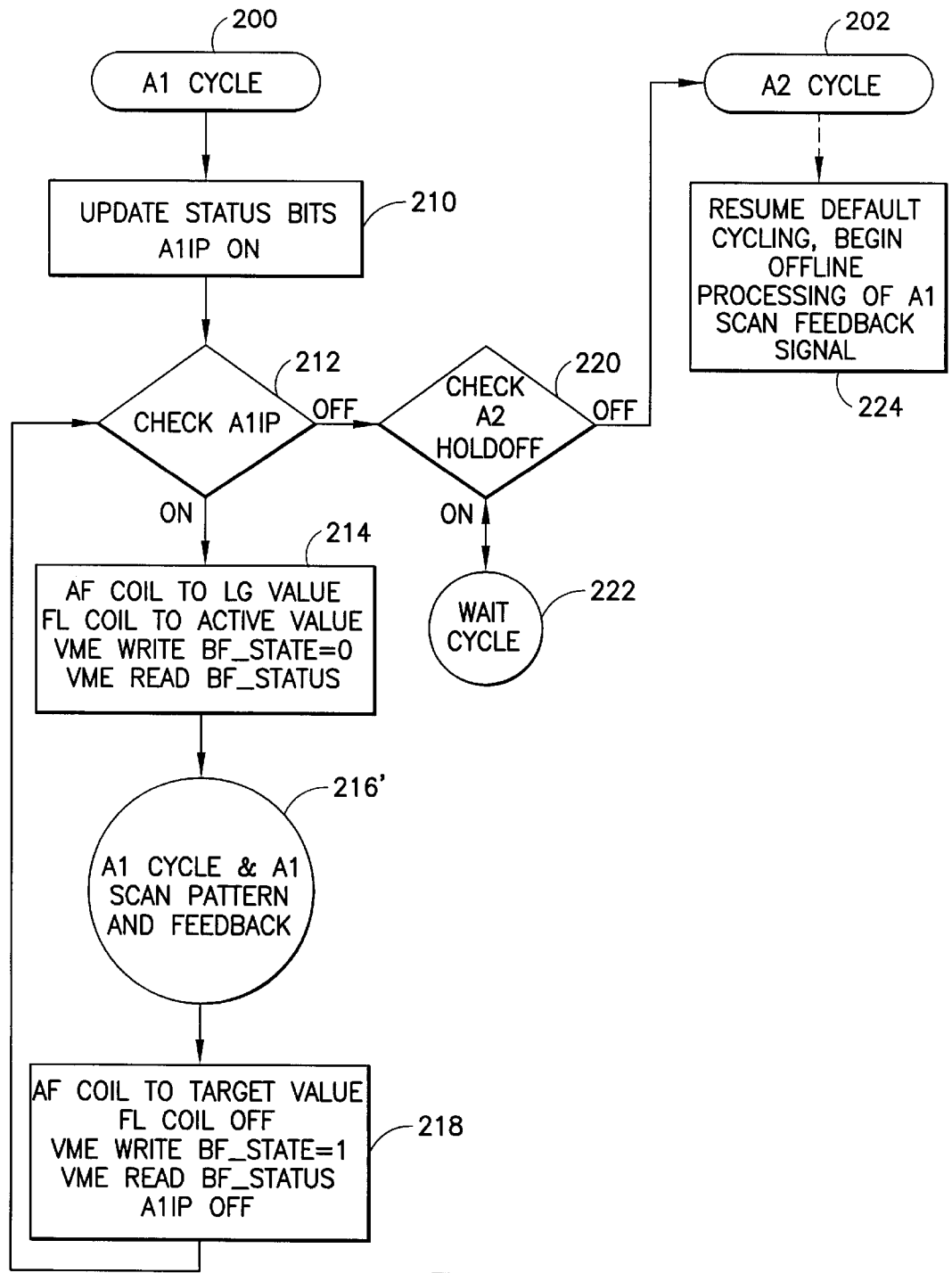
FIG. 8 is a flow diagram of an A1 cycle in which the locking target is scanned.

FIG. 8 is a flow diagram of an A1 cycle in which the locking target is scanned, but which otherwise is substantially the same as the flow diagram in FIG. 7. Accordingly, identical steps with identical function are identified with identical numbers. In the A1 cycle of FIG. 8, when the system enters the A1 cycle, in step 216', the locking target is scanned, measured and the scan results are fed back. Additionally, once the preferred e-beam lithography system enters the A2 cycle from the A1 cycle of FIG. 8, the system resumes default cycling and begins processing the A1 scan feedback signal in step 224.

As described with reference to FIG. 3, the mesh on the upper surface of the field locking target 116 provides an initial guide for the preferred system, aiding in initially locating suitable reference targets. When field locking is initially activated, the beam is sequentially deflected around the periphery of the field aperture 118, during an A1 cycle 180, at expected mark locations. In practice, however, because of deflection field distortions and mechanical positioning errors, the marks are seldom found at these initially expected locations. So, a searching algorithm is used to locate center subfield marks at each of the respective marks and, the corresponding mark command addresses are modified accordingly.

Figure 9:
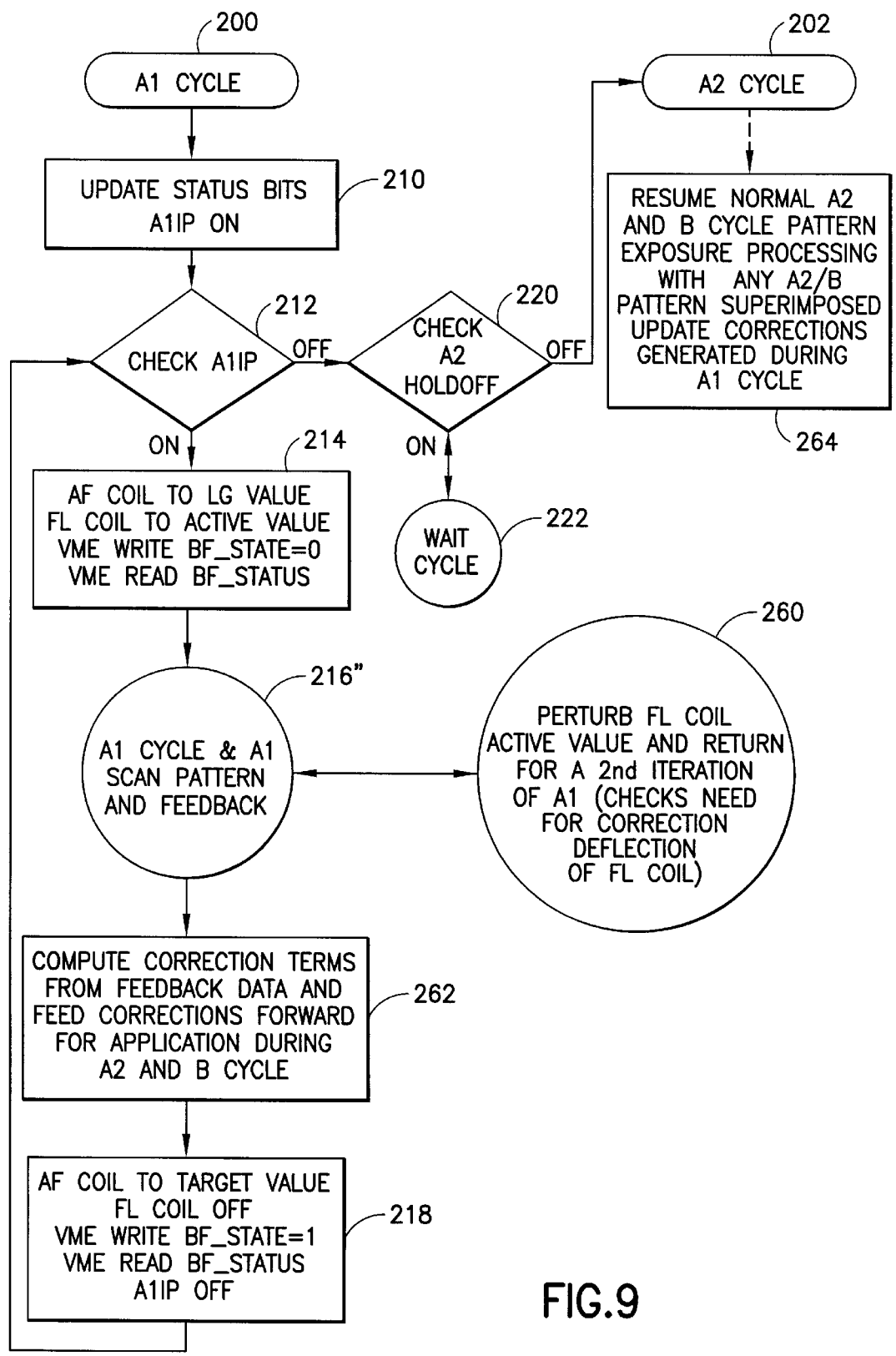
FIG. 9 is a flow diagram of the A1 cycle wherein target locking is performed in conjunction with pattern writing.

FIG. 9 is a flow diagram of the A1 cycle wherein target locking is done as a pattern is being written but, which otherwise is substantially the same as the flow diagram in FIG. 8. Accordingly, identical steps with identical function are identified with identical numbers. So, in step 216", as the pattern is being scanned, the registration focus coil 104a is checked in step 260 to determine whether correction is needed. This check is done by perturbing the field locking coil from a current value and returning for a second A1 iteration in step 216". After the second A1 iteration, in step 262, correction terms are computed and passed forward for application to pattern position controls during the A2 cycle 182 and B cycle 184. Also, during pattern writing, in step 264, after entering the A2 cycle 182, the patterns are adjusted using update corrections generated during the A1 cycle.

While the invention has been described in terms of preferred embodiments, those skilled in the art will recognize that the invention can be practiced with modification within the spirit and scope of the appended claims.

We claim:

1. An electron beam lithography system comprising:
an optics section containing beam deflection means for controlling the path of travel in operation of an electron beam traveling along a system axis from a source to a workpiece without passing through a mask to write spots on said workpiece to form pattern shapes;
a controllable stage at one end of said path of travel;
a target substrate held on said controllable stage being positioned with respect to a system axis;
a field locking target spaced above said controllable stage;
an aperture through said field locking target within a transverse deflection range of said electron beam;
alignment marks disposed around the aperture within said transverse deflection range of said electron beam, whereby said beam may strike said alignment marks without passing through any beam handling elements that are outside said path of travel during operation of said electron beam; and
a substrate alignment system measuring the relative positions of the field locking target and the substrate.

2. The system of claim 1, wherein the substrate alignment system comprises:
a laser;
a first target attached to said field locking target and reflecting laser energy from said laser; and
a second target attached to said substrate and reflecting laser energy from said laser.

3. The system of claim 2, wherein the field locking target includes a grid on one surface, periodicity of said grid being the same as beam subfield periodicity.

4. The system of claim 3, wherein the field locking target further includes at least one subfield scan area.

5. The system of claim 4, wherein the field locking target is carbon and the grid is gold.

6. The system of claim 5, wherein the field locking target further includes a gold layer on a surface opposite said one surface.

7. The system of claim 5, wherein the field locking target is positioned such that the grid is 4 mm above the target substrate.

8. The system of claim 5, wherein said aperture is sized to permit the beam to write a field on the substrate.

9. The system of claim 8, wherein the aperture is 0.2 mm larger than the field size.

10. The system of claim 1 further comprising: adjustment means for adjusting the field locking target position.

11. The system of claim 10 wherein the adjustment means mechanically adjusts the field locking plate position.

12. The system of claim 1 wherein the optics section is a Variable Axis Immersion Lens (VAIL).

13. The system of claim 12 wherein the optics section comprises:
beam deflection plates for deflecting the beam to a precise location;
registration focus means for refocusing the beam onto a reference target;
autofocus means for adjusting beam focus for target height variations;
magnetic beam deflection means for magnetically deflecting the beam to a subfield; and a projection lens axis shifting yoke shifting the lens variable axis to follow the deflected beam.

14. The system of claim 13 wherein the registration focus means and the autofocus means are a pair of concentric coils.

15. The system of claim 13 wherein the registration focus means and the autofocus means are provided by a single coil.

16. The system of claim 13 wherein the magnetic beam deflection means is a pair of coils.

17. A method of calculating drift correction values for an electron beam. alignment system, said method comprising:
   a) initiating movement of a stage to center a writing field on a substrate on said stage;
   b) while the stage is moving into position, sweeping an electron beam to hit marks adjacent to a centered field position;
   c) recording beam control data when said marks are hit and calculating beam correction values;
   d) measuring the relative positions of said stage and said centered field position and adjusting said centered field position as needed; and
   e) writing the centered writing field with said electron beam corrected by the calculated beam correction values.

18. The method of calculating drift correction values of claim 17, wherein the centered field position is within an aperture in a field locking stage and said marks are on said field locking stage, adjacent said aperture.

19. The method of calculating drift correction values of claim 18, before the step
   (a) of initiating stage movement, further comprising the steps of:
      a1) placing a calibration target at said writing field within said aperture;
      a2) sweeping said electron beam to hit said marks adjacent said aperture;
      a3) centering said marks within an expected location;
      a4) centering a first writing field within said aperture; and
      a5) writing a pattern on said first writing field.

20. The method of calculating drift correction values of claim 19, wherein the step (a3) of centering the marks comprises mechanically adjusting the location of said aperture.

21. The method of calculating drift correction values of claim 17, wherein the centered field position is within a feedback capture range of said electron beam alignment system.

* * * * *